United States Patent [19]

Hennecken

[11] Patent Number: 5,637,999
[45] Date of Patent: Jun. 10, 1997

[54] OPAMP BASED BROAD BAND PHASE SHIFTER FOR USE IN DETECTING FLAWS IN THE MEDIA OF DISKS FOR USE IN DISK DRIVES

[75] Inventor: Mark Hennecken, Parker, Colo.

[73] Assignee: Maxtor Corporation, Longmont, Colo.

[21] Appl. No.: 246,101

[22] Filed: May 19, 1994

[51] Int. Cl.$^6$ ............................ G01R 33/12; G01N 27/82
[52] U.S. Cl. .................................... 324/212; 369/58
[58] Field of Search ................................. 324/210–212, 324/233; 327/50, 58, 62, 254; 360/25, 31; 365/53, 58

[56] References Cited

U.S. PATENT DOCUMENTS 5,121,057   6/1992   Huber et al. ............................ 324/212

OTHER PUBLICATIONS

Smith, "Modern operational circuit Design", 1971 Wiley-–Interscience pp. 22 and 162.
Mileaf "Eletronics one–seven" 1967 Hayden Book Company, Inc. pp. 2–20.

*Primary Examiner*—Walter E. Snow
*Attorney, Agent, or Firm*—Sheridan Ross P.C.

[57] ABSTRACT

An electronic system for detecting flaws in the magnetic media of raw disks prior to assembly into disk drives which works in conjunction with an electro-mechanical apparatus that performs the functions of spinning the disk, impressing a sinusoidal signal onto the media of the spinning disk and subsequently reading back the signal from the spinning disk. The signal read from the disk is supplied as the electrical output of the electro-mechanical apparatus. The system includes a divider circuit to divide the read signal into two signal channels. An op amp based impedance matching circuit is connected to the output of the dividing circuit in each channel and matches the electrical impedance of the electro-mechanical apparatus with the impedance of the remainder of the electronic detection system. It passes the two signals through substantially unaltered. A two stage op amp based phase shifter circuit is connected to each of the impedance matching circuits and generates two output signals having substantially the same amplitude as the two input signals, but a phase difference with respect to each other of substantially 90° over a frequency range of approximately 3 to 22 megahertz. A multiplier circuit is connected to each phase shifter circuit. These circuits square each of the two output signals from the phase shifting circuits. A summing circuit sums the two output signals from the two multiplier circuits. This produces a DC signal value which is low pass filtered with a large time constant filter. The voltage value of the DC signal is used to determine the reference of a comparator circuit. The comparator circuit compares the amplitude of the output signal of the summing circuit with upper and lower limit values based on the reference and each time the output signal of the comparator circuit exceeds either the upper or lower limit, the comparator supplies an output signal to a computer which keeps track of the defects so determined.

24 Claims, 5 Drawing Sheets

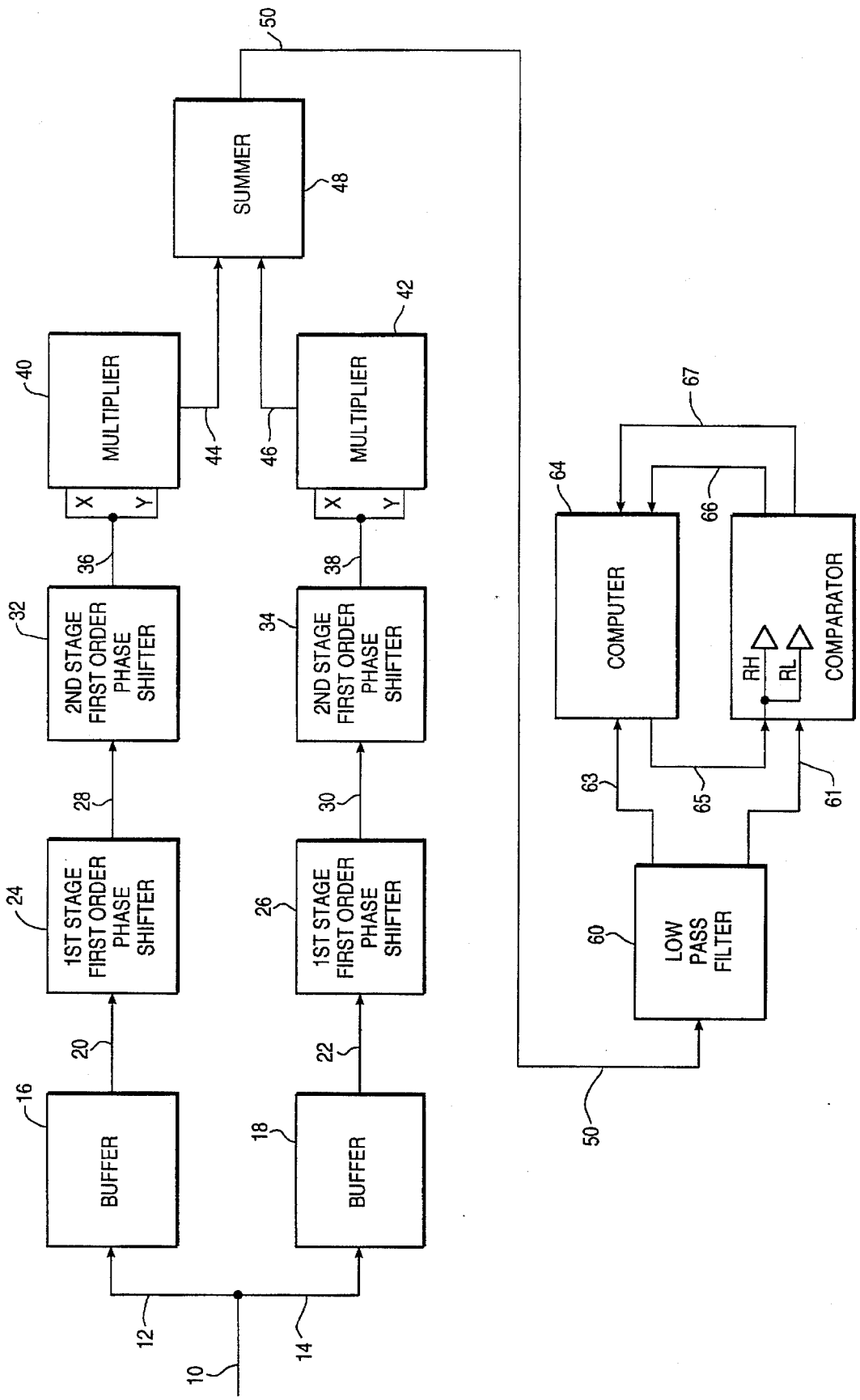

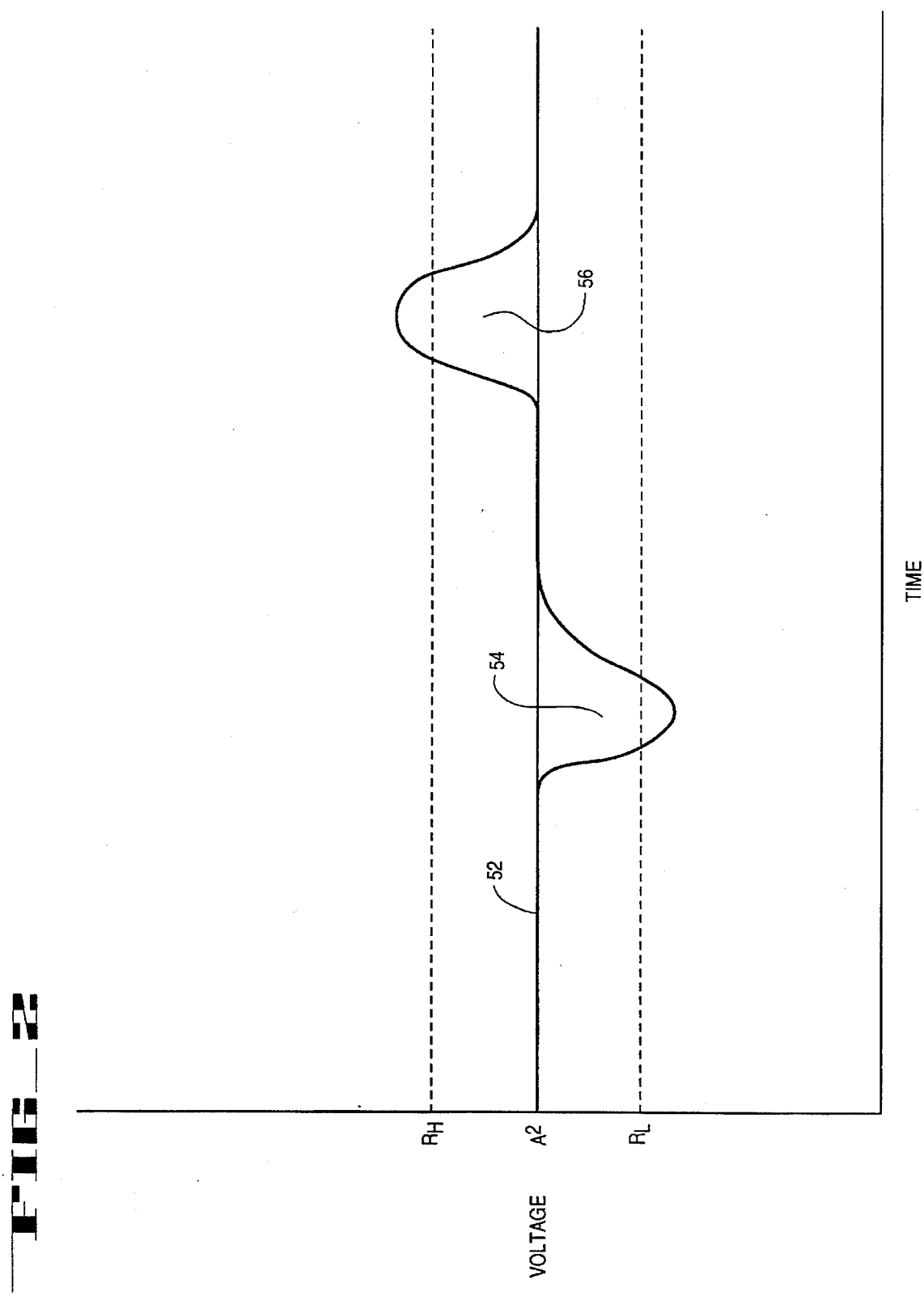
FIG_2

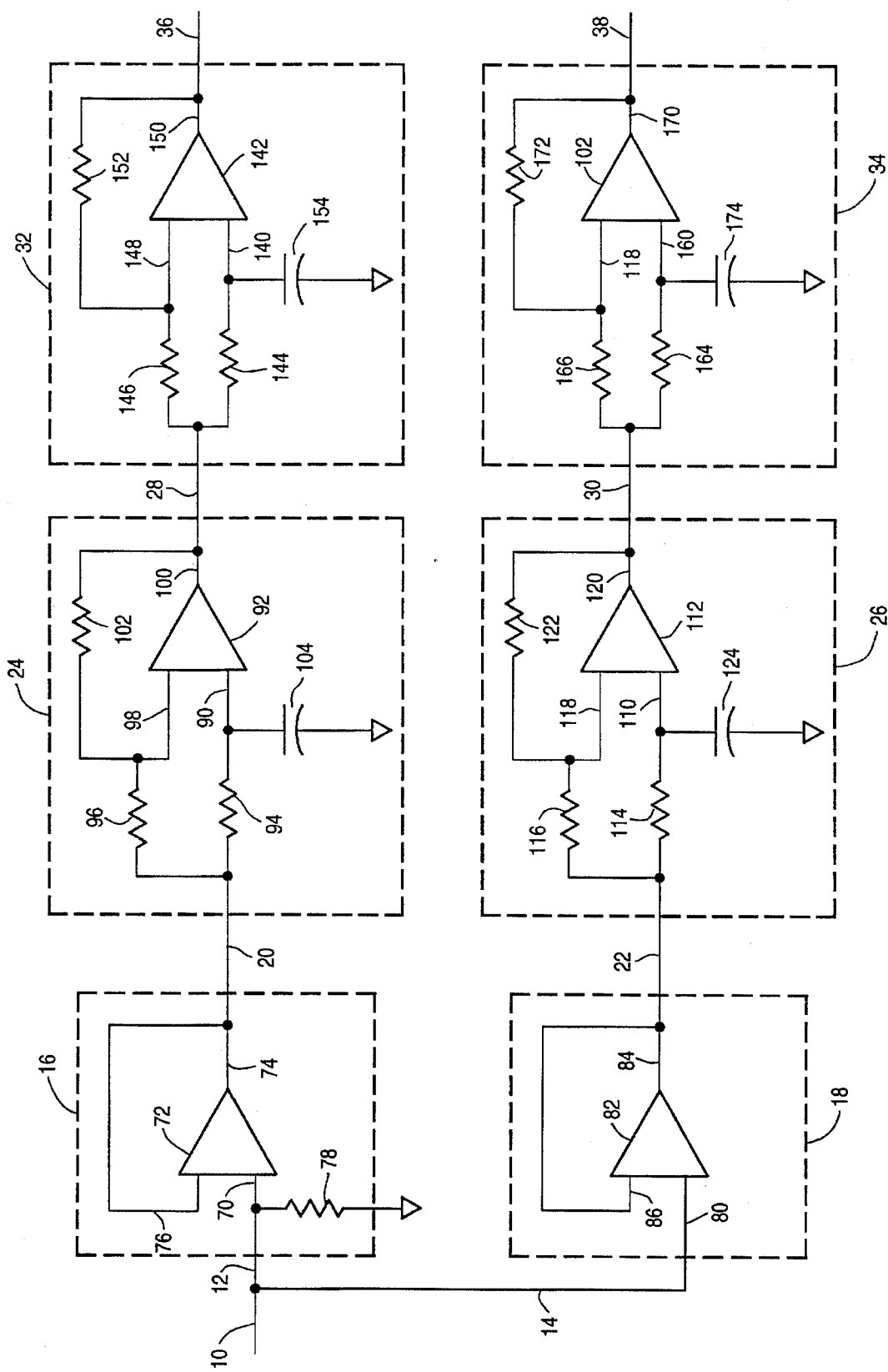

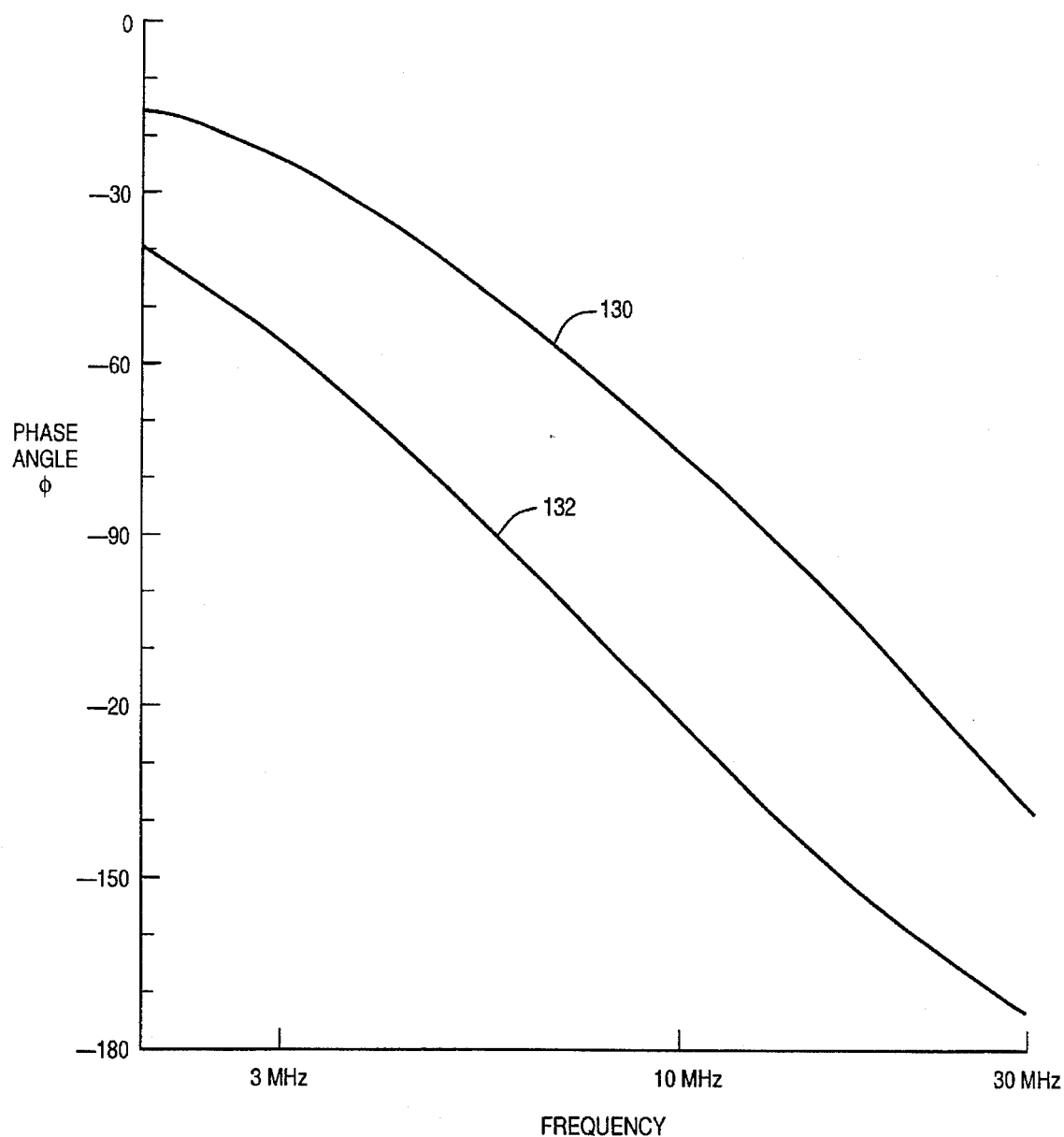
FIG_4

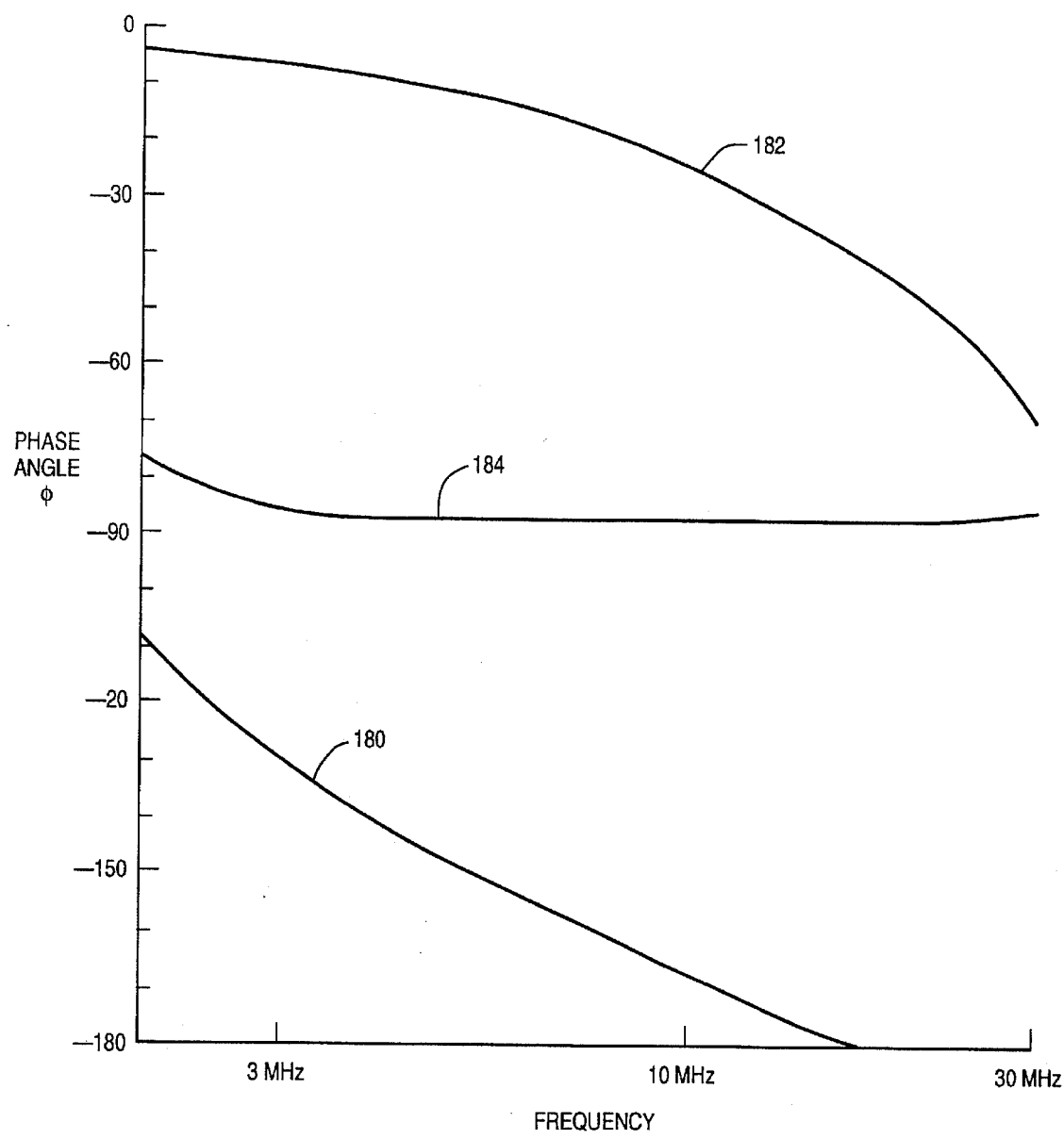
FIG_5

OPAMP BASED BROAD BAND PHASE SHIFTER FOR USE IN DETECTING FLAWS IN THE MEDIA OF DISKS FOR USE IN DISK DRIVES

BACKGROUND OF THE INVENTION

Field of the Invention

The present invention relates to test circuitry for finding flaws in the magnetic media of disks for use in disk drives. More particularly, it relates to an improved implementation of the in-phase/quadrature-phase method of detecting such flaws.

In the manufacture of hard disk drives, raw disks are delivered to the assembly operation for incorporation into disk drives. A raw disk consists of a platter that has the magnetic memory media deposited on one or both surfaces. The magnetic media is deposited using conventional thin film techniques. Because the technology does not currently exist to deposit thin films with no defects, a useful step in a low cost manufacturing process consists of testing the raw disks for flaws before the money is invested to assemble the disk into a drive.

This test step is accomplished in the prior art by writing a sine wave onto the raw disk with a fixture consisting of a mechanism to spin the disk and a head to write the signal. The sine wave is monitored by a "flash" analog to digital converter and an expensive phase locked loop synchronizing circuit. The phase lock loop synchronizes the flash analog to digital converter to sample the peaks of the sine wave. While this approach works well, it is complicated and expensive.

A second prior art approach uses a scheme called the in-phase/quadrature-phase (the "I/Q") method. This method consists of reading the sine wave by converting it to a DC value. However, prior to detection of the DC value, the second method takes advantage of the following relationship:

$$A^2\sin^2\phi + A^2\cos^2\phi = A^2 \quad (1)$$

where A is a constant.

That is, for all values of $\phi$, the sum of the squares of the sine and cos is a constant. With this relationship, it is possible to merely look at dc threshold levels rather than synchronizing an analog to digital converter with the peaks of a sine wave. The I/Q method is generally implemented by dividing the sine wave signal into two signals, shifting the phase of one of the signals by 90° relative to the other signal, squaring the signals and summing them. The resulting dc signal is then passed through a threshold detector. A signal that is greater or less than a predetermined percentage of nominal indicates a super pulse or a missing pulse, respectively.

The I/Q method as it is currently implemented has serious flaws. The current approach uses two passive resistor/capacitor all pass networks to shift the phase of one of the divided signals 90° with respect to the other. However, the two signals are at a 90° degree phase shift at only a fixed frequency. This does not provide the capability to use multiple frequencies appropriate for the drive. In addition, the center point and bandwidth of the 90° phase shifted signals depends on the circuit supplying the signal to the phase shift network and also on the circuit to which the phase shift network supplies the signal, i.e. a multiplier circuit. In addition, the resistors in the r/c network attenuate the signal. Finally, this approach requires exactly the same gain for both signals. But with r/c networks, this is very difficult.

SUMMARY OF THE INVENTION

Accordingly, it is an object of this invention to provide an I/Q test circuit with a broad bandwidth.

It is another object of this invention to provide an I/Q test circuit that is insensitive to its input circuit.

It is another object of this invention to provide an I/Q test circuit that is insensitive to its output circuit.

It is another object of this invention to provide an I/Q test circuit that does not attenuate the signal to be tested.

It is yet another object of this invention to provide an I/Q test circuit that does not require "tweaking" to get amplitude balance.

Finally, it is an object of this invention to provide a raw disk flaw mapper circuit that is high frequency, broad band, and capable of use by persons who are not highly skilled electronics technicians.

These and other objects of the invention are achieved by an electronic system for detecting flaws in the magnetic media of raw disks prior to assembly into disk drives which works in conjunction with an electro-mechanical apparatus that performs the functions of spinning the disk, impressing a sinusoidal signal onto the media of the spinning disk and subsequently reading back the signal from the spinning disk. The signal read from the disk is supplied as the electrical output of the electro-mechanical apparatus. The system includes a divider circuit connected to the output of the electro-mechanical apparatus for receiving the read signal and dividing it into two signals, each of which are substantially identical with the read signal supplied by the electro-mechanical apparatus. An impedance matching circuit is connected to the input of the dividing circuit and matches the electrical impedance of the electro-mechanical apparatus with the impedance of the electronic detection system. It passes the two signals through substantially unaltered. An active phase shifter circuit is connected to each of the impedance matching circuits and generates two output signals having substantially the same amplitude as the two input signals, but a phase difference with respect to each other of substantially 90° over a predetermined frequency range. A multiplier circuit is connected to each phase shifter circuit. These circuits square each of the two output signals from the phase shifting circuits. Next, a summing circuit is connected to the multiplier circuits and sums the two output signals from the two multiplier circuits. This produces a DC value which is low pass filtered with a large time constant filter, and is used to determine the reference of a comparator circuit over a long period of time. This circuit also compares the amplitude of the output signal of the summing circuit with upper and lower limit values based on the reference and supplies an output signal indicative of each instance that the signal exceeds either the upper or lower limit.

BRIEF DESCRIPTION OF THE DRAWING

The present invention will be described in more detail in connection with the drawing, wherein:

FIG. 1 is a block diagram of the raw disk flaw mapper electronic system;

FIG. 2 is graph of the output of the summing circuit of FIG. 1.

FIG. 3 is a schematic of a preferred embodiment of the phase shifter portion of the flaw mapper system;

FIG. 4 is a graph of the phase shift of the first stage phase shifters as a function of the frequency of the input signal.

FIG. 5 is a graph of the second stage phase shifters as a function of frequency and shows the resulting 90° difference as a function of the frequency between the two output signals.

DETAILED DESCRIPTION OF THE PREFERRED EMBODIMENT

FIG. 1 is a block diagram of the flaw mapper electronic system of the present invention. Not shown in FIG. 1 is an electro-mechanical apparatus for spinning a raw disk at a predetermined fixed angular rotation and a magnetic read head capable of detecting the sine wave signal which has been written onto the raw disk by the disk head. None of the foregoing are part of this invention and are well known in the art.

Referring to FIG. 1, the output of the read head previously mentioned is supplied to signal path 10 in FIG. 1. The output is divided into two separate signal channels as illustrated by signal paths 12 and 14 and supplied to buffers 16 in the first channel and 18 in the second channel. Buffers 16 and 18 isolate the remainder of the system from the electromechanical apparatus and are typical operational amplifier circuits. Signal paths 20 and 22 connect buffers 16 and 18 to phase shifters 24 and 26 respectively. Phase shifters 24 and 26 are also typical operational amplifier circuits having equal gains. Phase shifter 24 will shift the phase of its output 28 relative to its input 20 by an amount proportional to the frequency. Phase shifter 26 will also shift the phase of its output 30 relative to its input 22 by an amount proportional to the frequency.

With a single phase shifter only in the system, the bandwidth of the system is greatly limited as in the prior art. With the proper choice of resistor and capacitor values, the useable bandwidth can be extended to approximately 1 megahertz at the frequencies of interest. However, it is sometimes desirable to have an even broader bandwidth. This is possible by adding a second stage phase shifter.

To increase the effective bandwidth of h system, a second stage phase shifter is added to each channel. Accordingly, phase shifters 32 and 34 receive inputs 28 and 30 respectively. Phase shifter circuits 32 and 34 have equal gain while phase shifter 32 phase shifts its output 36 relative to its input 28 dependent on the frequency. Phase shifter 34 repeats the process. The phase shifters are set up such that phase shifter 32 continues where phase shifter 24 leaves off. The same is true of phase shifters 26 and 34. The result over a frequency range of 2 Mhz to 22 Mhz is that the output signal on 36 will be phase shifted 90° with respect to the output signal on line 38. Phase shifters 32 and 34 are also operational amplifier based.

Outputs 36 and 38 of phase shifters 32 and 34 respectively are connected to the x and y inputs of multiplier circuits 40 and 42 respectively. Multiplier circuits 40 and 42 are conventional off of the shelf circuits such as model AD834 manufactured by Analog Devices. They are shown in FIG. 1 connected such that the outputs of the second phase shifters 32 and 34 are squared. Thus the outputs 44 and 46 of multipliers 40 and 42 are the square of the outputs of second phase shifters 32 and 34. This is accomplished by providing the signals on line 36 to the x and y inputs of multiplier 40, and similarly by providing the signals on line 38 to both the x and y inputs of multiplier 42. Outputs 44 and 46 are connected to the inputs of a conventional operational amplifier summing circuit 48. A suitable operational amplifier for this function is as model EL2073 manufactured by Elantec. Output 50 of summing circuit 48 is the sum of the signals supplied to inputs 44 and 46.

Thus, the system shown in FIG. 1 as described so far performs the operation of Equation 1. The signal detected from read head and supplied to signal path 10 is Asin$\phi$, where A is the amplitude of the signal. The signal at output 36 is phase shifted 90° by phase shifters 24 and 32 over the bandwidth of 3 Mhz to 22 Mhz relative to the output 38 by phase shifters 26 and 34. And since $$\sin\phi = \cos(\phi + 90°) \qquad (2)$$

output 38 is Acos$\phi$. The outputs 36 and 38 are Asin$\phi$ and Acos$\phi$ respectively. The outputs of multipliers 40 and 42 are $A^2\sin^2\phi$ and $A^2\cos^2\phi$ respectively. When summed together by summer 48 the output result is a dc voltage of amplitude $A^2$.

FIG. 2 is a graph of the voltage signal on output 50 of summing circuit 48 in FIG. 1. The output of summing circuit 48 is the dc value $A^2$ as specified by Equation 1 for so long as there are no defects in the media of the raw disks being tested. Defects in the media of a raw disk show up as a dip or rise in the dc output 50 as shown in FIG. 2.

Defects in the media may take several forms. The most common are: a missing pulses and super pulses. A missing pulse occurs where the media is unable to remain magnetized. This can occur when the magnetic layer is thin. A super pulse can occur where there is excess magnetic material If the media is normal, the voltage level at the output 50 of summing circuit 48 is $A^2$ as indicated by reference numeral 52 in FIG. 2. When a missing pulse is encountered, the dc voltage level on the output of summing circuit 48 dips as shown at reference numeral 54. When a super pulse is encountered, the dc voltage level on the output of summing circuit 48 bulges upward as shown at reference numeral 56.

Referring again to FIG. 1, output 50 of summing circuit 48 is supplied to low pas filter 60 which limits the maximum frequency content of the defect that will be measured. The output of low pass filter 60 is supplied by signal path 61 to a window comparator 62 and via signal path 63 to computer 64. Computer 64 supplies a reference signal to comparator 62 via signal path 65.

The signal supplied to computer 64 is first digitized by an analog to digital converter (not shown). Computer 64 determines the average value of the output signal of low pass filter 60 by statistical sampling procedures. The average thus determined is used to set two reference levels, $R_H$ and $R_L$ which are supplied to comparator 62 via signal path 65. Comparator 62 provides a logical output (either a 0 or 1) via output 66 or 67 to computer 64. Comparator 62 is in a preferred embodiment an off of the shelf "comparator" such as model AD9698 manufactured by Analog Devices. Such a comparator will detect a variation in either direction.

Referring again to FIG. 2, reference signal levels, $R_H$ and $R_L$ are set in comparator 62 by computer 64. Each time the dc value of the voltage on signal path 61 either exceeds or falls below the two reference levels, $R_H$ and $R_L$, comparator 62 will provide a digital logic 1 output on line 66 or 67. $R_H$ and $R_L$ are nominally set at +/−35% of the average value as calculated by computer 64, but are programmable.

Computer 64 keeps track of the location and type of defect and contains decision rules for determining whether to reject the raw disk.

FIG. 3 is a schematic of a preferred embodiment of the front end of the electronic system. This consists of buffers 16 and 18; phase shifters 24, 26 32 and 34. Referring now to FIG. 3, the signal coming from the electro-mechanical apparatus (not shown) is present on signal path 10. In the preferred embodiment, signal path 10 is a 50 ohm coaxial cable. Signal path 10 is also the input to the non inverting input 70 of operational amplifier (the "opamp") 72. Output 74 of opamp 72 is connected in a negative feedback configuration to inverting input 76. Resistor 78 is connected between non-inverting input 70 and ground. An operational amplifier connected in this fashion is known as a voltage follower. The output impedance is substantially 0, and the input impedance is determined by the value of resistor 78. In the preferred embodiment, resistor 78 is chosen to be approximately 50 ohms to match the impedance on signal path 10. With this value, the input impedance of opamp 72 is also 50 ohms. A suitable opamp for this application is model EL2073 manufactured by Elantec.

Signal path 10 is also connected via signal path 14 to non-inverting input 80 of opamp 82. Output 84 of opamp 82 is connected in a negative feedback configuration to the inverting input 86. There is no resistor between input 80 and ground. Thus the input impedance of the entire phase shift circuit is controlled by resistor 78 and is approximately 50 ohms. The output impedance of operational amplifier 82 is substantially 0.

Output 20 of buffer 16 is connected to the non-inverting input 90 of opamp 92 through resistor 94 and through resistor 96 to the inverting input 98 of opamp 92. Output 100 of opamp 92 is connected in a negative feedback configuration through resistor 102 to inverting input 98. Capacitor 104 is connected between input 90 and ground. Resistor 94 and capacitor 104 cause the phase of output 28 to change with respect to input 20. The change in phase varies as a function of the frequency of the input signal. Resistor 94 and capacitor 104 are chosen to provide the desired phase shift. Resistors 96 and 102 are then chosen to control the gain of the stage. In the preferred embodiment, resistor 94, 96 and 102 are substantially equal and the gain of the stage is substantially 1. Specific values for the resistors is 87 ohms and 330 picro farads for capacitor 104. This set of values provides a phase shift as will be described in connection with FIG. 4.

In like manner, output 22 of buffer 18 is connected to non-inverting input 110 of opamp 112 through resistor 114 and through resistor 116 to the inverting input 118 of opamp 112. Output 120 of opamp 112 is connected in a negative feedback configuration through resistor 122 to inverting input 118. Capacitor 124 is connected between input 110 and ground. Resistor 114 and capacitor 124 cause the phase of output 30 to change with respect to input 22. The change in phase varies as a function of the frequency of the input signal. Again, resistor 114 and capacitor 124 are chosen to provide the desired phase shift, and resistors 116 and 122 are chosen to control the gain of the stage. In a preferred embodiment, resistor 114, 116 and 122 are substantially equal and the gain of the stage is substantially 1. In the preferred embodiment, the resistors are 215 ohms and capacitor 124 is 50 picro-farads. This set of values provides a second phase shift as will be described in connection with in FIG. 4.

FIG. 4 is a graph of the phase shift of phase shifters 24 and 26 as a function of the frequency of the input signal. The ordinate scale is in degrees of phase shift. The abscissa scale is frequency in megahertz and is logarithmic. Referring now to FIG. 4, output 30 of phase shifter 26 is shown as curve 130, and output 28 of phase shifter 24 is shown as curve 132. Resistor 114 and capacitor 124 are chosen such that the phase shift of output 30 begins at about 500 kilohertz and has reached −180° at about 50 megahertz. The phase shift of output 30 declines more or less linearly from approximately 6 megahertz until 25 megahertz. Resistor 94 and capacitor 104 are chosen such that the phase shift of output 28 commences at about 100 kilohertz. It declines more or less linearly from approximately 1 megahertz to 12 megahertz and reaches −180° at approximately 35 megahertz.

Referring again to FIG. 3, output 28 of phase shifter 24 is connected to the non-inverting input 140 of opamp 142 through resistor 144 and through resistor 146 to the inverting input 148 of opamp 142. Output 150 of opamp 142 is connected in a negative feedback configuration through resistor 152 to inverting input 148. Capacitor 154 is connected between non-inverting input 140 and ground. Resistor 144 and capacitor 154 cause the phase of output 36 to change with respect to input 28. The change in phase varies as a function of the frequency of the input signal. Resistor 144 and capacitor 154 are chosen to provide the desired phase shift. Resistors 146 and 152 are then chosen to control the gain of the stage. In a preferred embodiment, resistor 144, 146 and 152 are substantially equal and the gain of the stage is substantially 1. A specific value for the resistors is 84.5 ohms and a specific value for capacitor 154 is 33 picro farads.

In like manner, output 30 of phase shifter 26 is connected to the non-inverting input 160 of opamp 162 through resistor 164 and through resistor 166 to the inverting input 168 of opamp 162. Output 170 of opamp 162 is connected in a negative feedback configuration through resistor 172 to inverting input 168. Capacitor 174 is connected between input 160 and ground. Resistor 164 and capacitor 174 again cause the phase of output 38 to change with respect to input 30. The change in phase varies as a function of the frequency of the input signal. Again, resistor 164 and capacitor 174 are chosen to provide the desired phase shift, and resistors 166 and 172 are then chosen to control the gain of the stage. In a preferred embodiment, resistors 164, 166 and 172 are substantially equal and the gain of the stage is substantially 1. In a preferred embodiment, the value for the resistors is 215 ohms and 500 picro-farads for capacitor 174.

FIG. 5 is a graph of the second stage phase shifters as a function of the frequency of the input signal and the resulting 90° difference between the two outputs. The ordinate scale is in degrees of phase shift. The abscissa scale is frequency in megahertz and is logarithmic. Referring now to FIG. 5, output 38 is shown as curve 180, and output 36 is shown as curve 182. Resistor 164 and capacitor 174 are chosen such that the phase shift of output 38 with respect to input 14 is approximately −108° at 1 megahertz and has reached −180° by the time the frequency reaches 18 megahertz. Resistor 144 and capacitor 154 are chosen such that the phase shift of output 36 with respect to input 12 is approximately −8° at 1 megahertz and is approximately −74° at 30 megahertz. Curve 184 represents the difference between signals 36 and 38, and is substantially 90° over a frequency range from 3 megahertz to 22 megahertz.

Phase shifters 32 and 34 have extended the system bandwidth, that is the frequency range through which the resultant phase difference in the output signals 36 and 38 is nominally 90° from approximately 3 megahertz to approximately 22 megahertz.

It would, of course, be possible to have a third order phase shifter that would extend the bandwidth even further. Indeed, additional phase shifters could be added until the bandwidth of the basic circuit component is exceeded.

It will be appreciated that the preferred embodiment is subject to numerous modifications without departing from the scope of the invention which is defined in the appended claims.

What is claimed is:

1. An electronic detection system for detecting flaws in the magnetic media of raw disks prior to assembly into disk drives, said electronic detection system being for use in conjunction with a signal read and write apparatus that spins the disk, impresses a sinusoidal signal into the media of the spinning disk, subsequently reads the signal previously impressed onto the media from the spinning disk and supplies the read signal as an electrical output, said electronic detection system comprising:

dividing means connected electrically to the read and write apparatus for receiving the read signal and dividing the read signal into first and second signals, each of which are substantially identical with the read signal supplied by the read and write apparatus;

impedance matching means connected to said dividing means for matching the electrical impedance of the read and write apparatus with the electrical impedance of said electronic detection system so that the electrical characteristics of said first and second signals provided to said electronic detection system are substantially unaffected by the electrical impedance of the read and write apparatus, thereby improving the sensitivity of said electronic detection system in detecting flaws in the media, and passing said first and second signals therethrough substantially unaltered;

phase shifting means connected to said impedance matching means for receiving said first and second signals and generating third and fourth signals having substantially the same amplitude as said first and second signals and a phase difference with respect to each other of substantially 90° over a predetermined frequency range;

multiplication means connected to said phase shifting means for receiving said third and fourth signals and squaring said third and fourth signals to form fifth and sixth signals that are the square of said third and fourth signals respectively;

summing means connected to said multiplication means for receiving said fifth and sixth signals and summing said fifth and sixth signals to form a seventh signal; and comparator means connected to said summing means for receiving said seventh signal and comparing the amplitude of said seventh signal with predetermined upper and lower limit values and supplying an output signal indicative of each instance that the amplitude of said seventh signal exceeds either said upper or lower limit value;

wherein said phase shifting means comprises:

first stage phase shifting circuitry for shifting the phase of said first signal with respect to said second signal by a first phase shift angle over a first bandwidth; and second stage phase shifting circuitry connected to said first stage phase shifting circuitry and adapted for shifting the phase of said first signal with respect to said second signal by an additional second phase shift angle over a second bandwidth to provide said third and fourth signals, said first and second bandwidths being contiguous and whereby said first and second stage active phase shifting circuitry provide a 90 degree phase shift between said third and fourth signals.

2. The electronic detection system of claim 1 wherein said first and second bandwidths are contiguous from 3 megahertz to 22 megahertz.

3. The electronic detection system of claim 1 wherein said dividing means and said impedance matching means comprise first and second operational amplifiers each having a non-inverting input and an output and wherein said non-inverting input of said first operational amplifier and the non-inverting input of said second operational amplifier are each connected to the output of the reading and writing apparatus.

4. The electronic detection system of claim 1 wherein said phase shifting means comprises:

a third operational amplifier having inverting and non-inverting inputs and an output, said inverting and non-inverting inputs being each connected to the output of said first operational amplifier and said non-inverting input is capacitively connected to ground; and a fourth operational amplifier having inverting and non-inverting inputs and an output, said inverting and non-inverting inputs being each connected to the output of said second operational amplifier and said non-inverting input is capacitively connected to ground.

5. An electronic system for detecting flaws in the magnetic media of raw disks prior to assembly into disk drives, said electronic detection system being for use in conjunction with a signal read and write apparatus that spins the disk, impresses a sinusoidal signal into the media of the spinning disk, subsequently reads the signal previously impressed onto the media from the spinning disk and supplies the read signal as an electrical output, the combination comprising:

dividing means connected electrically to the output of said read and write apparatus for receiving said read signal, said means being adapted to divide said read signal into first and second signals, each of which are substantially identical with said read signal supplied by said read and write apparatus;

impedance matching means connected to said dividing means for matching the electrical impedance of said read and write apparatus with the impedance of said electronic detection system and passing said first and second signals therethrough substantially unaltered;

phase shifting means connected to said impedance matching means so as to receive said first and second signals, said phase shifting means being adapted for generating third and fourth signals having substantially the same amplitude as said first and second signals and a phase difference with respect to each other of substantially 90° over a predetermined frequency;

multiplication means connected to said phase shifting means so as to receive said third and fourth signals, said multiplication means being adapted to square said third and fourth signals to form a fifth and sixth signals that are the square of said third and fourth signals respectively;

summing means connected to said multiplication means so as to receive said fifth and sixth signals, said summing means being adapted to sum said fifth and sixth signals to form a seventh signal;

comparator means connected to said summing means so as to receive said seventh signal, said comparator means being adapted for comparing the amplitude of said seventh signal with predetermined upper and lower limit values and supplying an output signal indicative of each instance that said seventh signal exceeds either said upper or lower limit;

wherein said dividing means and said impedance matching means comprise first and second operational amplifiers each having a non-inverting input and an output and wherein said non-inverting input of said first operational amplifier and the non-inverting input of said second operational amplifier are each connected to the output of said reading and writing apparatus; and wherein said phase shifting means comprises:

a third-operational amplifier having inverting and non-inverting inputs and an output, said inverting and non-inverting inputs being each resistively connected to the output of said first operational amplifier and said non-inverting input is capacitively connected to ground;

a fourth operational amplifier having inverting and non-inverting inputs and an output, said inverting and non-inverting inputs being each resistively connected to the output of said second operational amplifier and said non-inverting input is capacitively connected to ground, said resistances and capacitances of said third and fourth operational amplifiers being chosen to shift the phase of the output of said third operational amplifier with respect to said fourth operational amplifier by a given phase shift over a fixed first bandwidth;

a fifth operational amplifier having inverting and non-inverting inputs and an output, said inverting and non-inverting inputs being each resistively connected to the output of said third operational amplifier and said non-inverting input is capacitively connected to ground; and a sixth operational amplifier having inverting and non-inverting inputs and an output, said inverting and non-inverting inputs being each connected to the output of said fourth operational amplifier and said non-inverting input is capacitively connected to ground, said resistances and capacitances of said fifth and sixth operational amplifiers being chosen to shift the phase of the output of said fifth operational amplifier with respect to said sixth operational amplifier by substantially a fixed amount of phase shift over a fixed second and wherein said first and second bandwidths are contiguous.

6. The electronic detection system of claim 5 wherein:

said resistor and capacitor of said third operational amplifier are chosen to cause the phase of the output of said third operational amplifier to shift with respect to the input thereof by −5° commencing at a frequency of 100 kilohertz and ending at −180° a frequency of 30 megahertz;

said resistor and capacitor of said fourth operational amplifier are chosen to cause the phase of the output of said fourth operational amplifier to shift with respect to the input thereof by −5° commencing at a frequency of 500 kilohertz and ending at −180° at a frequency of 50 megahertz;

said resistor and capacitor of said fifth operational amplifier are chosen to cause the phase of the output of said fifth operational amplifier to shift with respect to the input to said third operational amplifier is approximately −108° at 1 megahertz and −180° at 30 megahertz;

said resistor and capacitor of said sixth operational amplifier are chosen to cause the phase of the output of said sixth operational amplifier to shift with respect to the input to said fourth operational amplifier is approximately −8° at 1 megahertz and −74° at 30 megahertz, whereby said result is a 90° phase shift between said sixth and fifth operational amplifiers.

7. The electronic detection system of claim 6 further comprising a computer connected to the output of said comparator for recording all events wherein the output of said summing means exceeds said upper or lower limits.

8. The electronic detection system of claim 7 wherein said upper and lower limit values of said comparator are programmable.

9. The electronic detection system of claim 1 wherein: said phase shifting means includes:

first active circuit phase shifter means for receiving said first signal and providing a third signal shifted in phase with respect to said first signal by a first phase angle function that varies with the frequency of said first output signal; and second active circuit phase shifter means for receiving said second signal and providing a fourth signal shifted in phase with respect to said second output signal by a second phase angle function that varies with the frequency of said second output signal, and wherein the relationship of said first phase angle function and said second phase angle function is such that said third signal is substantially 90° out of phase with said fourth signal over said predetermined frequency range;

wherein said first active circuit phase shifter means includes first and second phase shifting stages coupled in series and each contributing to said first phase angle function; and wherein said second active circuit phase shifter means includes first and second phase shifting stages coupled in series and each contributing to said second phase angle function.

10. The electronic detection system of claim 9 wherein said first and second active circuit phase shifter means comprise unitary gain operational amplifier circuits having a resistor and capacitor input network whose values are chosen to provide said first and second phase angle functions.

11. An electronic system for detecting flaws in the magnetic media of raw disks prior to assembly into disk drives, said electronic detection system being for use in conjunction with a signal read and write apparatus that spins the disk, impresses a sinusoidal signal into the media of the spinning disk, subsequently reads the signal previously impressed onto the media from the spinning disk and supplies the read signal as first and second electrical output signals, the combination comprising:

first active circuit phase shifter means communicating electrically with said read and write apparatus for receiving said first output signal therefrom, said first active phase shifter being adapted to provide an output signal shifted in phase with respect to said first output signal from said read and write apparatus by a first phase angle function that varies with the frequency of said first output signal;

second active circuit phase shifter means communicating electrically with said read and write apparatus for receiving said second output signal therefrom, said second active phase shifter being adapted to provide an output signal shifted in phase with respect to said second output signal from said read and write apparatus by a second phase angle function that varies with the frequency of said second output signal, and wherein the relationship of said first phase angle function and said second phase angle function is such that the output signal of said first active phase shifter means is substantially 90° out of phase with the output signal of said second active phase shifter means over a fixed bandwidth;

squaring and summing means connected to said first and second phase shifting means for first squaring and then summing the output signals from said first and second active phase shifter means;

comparator means connected to said squaring and summing means and being adapted for comparing the amplitude of the output signal of said squaring and summing means with predetermined reference signal and supplying an output signal indicative of the amplitude of the output signal of said squaring and summing means exceeding said reference;

wherein said bandwidth is from 3 to 22 megahertz;

wherein said first active circuit phase shifter means includes a first and second stage coupled in series and each contributing to said first phase angle function; and wherein said second active circuit phase shifter means includes a first and second stage coupled in series and each contributing to said second phase angle function;

wherein said first and second stage active phase shifter means comprise unitary gain operational amplifier circuits having a resistor and capacitor input network whose values are chosen to provide said first and second phase angle functions;

wherein the component values in said resistor and capacitor network of said first and second phase shifter means are chosen such that the phase difference between the two outputs of said first and second phase shifters differ from each other by between 30° and 45° over a frequency range of from 3 megahertz and 30 megahertz.

12. The electronic system of claim 11 further comprising a computer connected to the output of said comparator means for tracking the location of any defects in the media.

13. The electronic system of claim 12 further comprising a low pass filter circuit connected between the output of said squaring and summing means and said comparator means and said computer, said low pass filter adapted to determine the maximum frequency content of the defect that will be measured.

14. The electronic system of claim 13 wherein said computer determines the average value of the amplitude of the output signal from said low pass filter, calculates an upper and lower limit around said average value and supplies said limits to said comparator; and said comparator provides a signal to said computer if the output of said low pass filter exceeds either said upper or lower limit.

15. The electronic system of claim 14 wherein said upper and lower limits are plus or minus a fixed percentage of said average value.

16. The electronic system of claim 15 wherein said fixed percentages are 35%.

17. An electronic system for detecting flaws in the magnetic media of raw disks prior to assembly into disk drives, said electronic detection system being for use in conjunction with a signal read and write apparatus that spins the disk, impresses a sinusoidal signal into the media of the spinning disk, subsequently reads the signal previously impressed onto the media from the spinning disk and supplies the read signal as an electrical output, the combination comprising:

first and second operational amplifiers each having a non-inverting input connected to the output of said reading and writing apparatus, said first and second operational amplifiers being adapted to match the electrical impedance of said read and write apparatus with the impedance of said electronic detection system and pass said first and second signals therethrough substantially unaltered;

a third operational amplifier having inverting and non-inverting inputs and an output, said inverting and non-inverting inputs each resistively connected to the output of said first operational amplifier and said non-inverting input capacitively connected to ground, said resistor and capacitor of said third operational amplifier being chosen to cause the phase of the output of said third operational amplifier to shift with respect to the input thereof by −5° commencing at a frequency of 100 kilohertz and ending at −180° a frequency of 30 megahertz;

a fourth operational amplifier having inverting and non-inverting inputs and an output, said inverting and non-inverting inputs each resistively connected to the output of said second operational amplifier and said non-inverting input is capacitively connected to ground, said resistor and capacitor of said fourth operational amplifier being chosen to cause the phase of the output of said fourth operational amplifier to shift with respect to the input thereof by −5° commencing at a frequency of 500 kilohertz and ending at −180° at a frequency of 50 megahertz;

a fifth operational amplifier having inverting and non-inverting inputs and an output, said inverting and non-inverting inputs each resistively connected to the output of said third operational amplifier and said non-inverting input is capacitively connected to ground, said resistor and capacitor of said fifth operational amplifier being chosen to cause the phase of the output of said fifth operational amplifier to shift with respect to the input thereof by 5° commencing at a frequency of 100 kilohertz and ending at a frequency of 30 megahertz with a phase shift of −260°;

a sixth operational amplifier having inverting and non-inverting inputs and an output, said inverting and non-inverting inputs each connected to the output of said fourth operational amplifier and said non-inverting input capacitively connected to ground, said resistor and capacitor of said sixth operational amplifier being chosen to cause the phase of the output of said sixth operational amplifier to shift with respect to the input thereof by 5° commencing at a frequency of 500 kilohertz and ending at a frequency of 30 megahertz with a phase shift of −340° a first multiplication circuit connected to the output of said fifth operational amplifier, said first multiplication circuit being adapted to square the output of said fifth operational amplifier;

a second multiplication circuit connected to the output of said sixth operational amplifier, said second multiplication circuit being adapted to square the output of said sixth operational amplifier;

a summing circuit connected to said first and second multiplication circuits, said summing circuits being adapted to sum the outputs of said first and second multiplication circuits;

a low pass filter circuit connected to the output of said summing circuit and adapted to pass all signals below a predetermined frequency;

a comparator circuit connected to said summing circuit, said comparator circuit being adapted for comparing the amplitude of the output signal of said low pass filter circuit with upper and lower limit values and supplying an output signal indicative of each instance that said output signal of said low pass filter circuit exceeds either said upper or lower limit;

a computer connected to the output of said comparator for recording all events wherein the output of said summing circuit exceeds said upper or lower limit.

18. An electronic detection system for detecting flaws in the magnetic media of raw disks prior to assembly into disk drives, said electronic detection system being for use in conjunction with a signal read and write apparatus that spins the disk, impresses a sinusoidal signal into the media of the spinning disk, subsequently reads the signal previously impressed onto the media from the spinning disk and supplies the read signal as first and second signals, said electronic detection system comprising:

first stage phase shifting circuitry operatively connected to the read and write apparatus for receiving the first and second signals and establishing a first phase shift between the first and second signals, and providing third and fourth signals with said first phase shift therebetween;

second stage phase shifting circuitry operatively connected to said first stage phase shifting circuitry for receiving said third and fourth signals and establishing a second phase shift between said third and fourth signals, and providing fifth and sixth signals with said first and second phase shifts therebetween;

wherein said first and second stage phase shifting circuitry provide a phase difference between said fifth and sixth signals of substantially 90° over a known bandwidth that is larger than that provided by a single stage phase shifting circuit, thereby improving the sensitivity of said electronic detection system in detecting flaws in the media;

multiplication means, operatively connected to said second stage phase shifting circuitry, for receiving and then squaring said fifth and sixth signals to form seventh and eighth signals;

summing means, operatively connected to said multiplication means, for receiving and then summing said seventh and eighth signals to form a ninth signal; and comparator means operatively connected to said summing means for receiving said ninth signal and supplying an output signal when the amplitude of said ninth signal exceeds a limit value.

19. The electronic detection system of claim 18, wherein:
at least one of said first and second stage phase shifting circuitry comprises at least one active circuit component.

20. The electronic detection system of claim 19, wherein:
said at least one active circuit component comprises an operational amplifier.

21. The electronic detection system of claim 19, wherein:
said at least one active circuit component comprises an operational amplifier having a resistor and capacitor input network whose values are chosen to provide one of said first and second phase shifts.

22. The electronic detection system of claim 18, wherein:
said comparator means comprises means for determining said limit value as an upper and lower limit around the average amplitude value of said ninth signal.

23. The electronic detection system of claim 18, further comprising:
impedance matching means operatively connected between the read and write apparatus and said first stage phase shifting circuitry for matching the electrical impedance of the read and write apparatus with the electrical impedance of said electronic detection system so that the electrical characteristics of the first and second signals are substantially unaffected by the electrical impedance of the read and write apparatus.

24. The electronic detection system of claim 18 wherein said bandwidth is from 3 to 22 megahertz.

* * * * *